(12) United States Patent
Swan et al.

(10) Patent No.: US 9,361,059 B2
(45) Date of Patent: Jun. 7, 2016

(54) ARCHITECTURE FOR SEAMLESS INTEGRATED DISPLAY SYSTEM

(71) Applicant: Intel Corporation, Santa Clara, CA (US)

(72) Inventors: Johanna Swan, Scottsdale, AZ (US); Uygar Avci, Portland, OR (US); Islam A. Salama, Chandler, AZ (US); Ravi Pallarisetty, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 58 days.

(21) Appl. No.: 13/715,193

(22) Filed: Dec. 14, 2012

(65) Prior Publication Data

US 2014/0168032 A1    Jun. 19, 2014

(51) Int. Cl.

| | |
|---|---|
| *G09G 5/00* | (2006.01) |
| *G06F 3/14* | (2006.01) |
| *G09F 9/302* | (2006.01) |
| *G09F 9/35* | (2006.01) |
| *H01L 27/32* | (2006.01) |
| *G09G 3/20* | (2006.01) |
| *G02F 1/1333* | (2006.01) |
| *G02F 1/1345* | (2006.01) |

(52) U.S. Cl.
CPC ............ *G06F 3/1446* (2013.01); *G02F 1/1345* (2013.01); *G02F 1/13336* (2013.01); *G09F 9/3026* (2013.01); *G09F 9/35* (2013.01); *G09G 3/20* (2013.01); *H01L 27/3293* (2013.01); *G09G 2300/026* (2013.01); *G09G 2320/02* (2013.01); *G09G 2340/14* (2013.01)

(58) Field of Classification Search
CPC ........... H01L 2224/48227; H01L 2224/73265; H01L 2924/15311; H01L 27/3293; H01L 23/49827; G02F 1/13336; G02F 1/133603; G02F 1/1345; G02F 1/133608; G02F 1/13452; G02F 2201/42; G06F 3/1446; G06F 3/147; G09G 2300/026; G09G 2300/0426; G09F 9/3026
USPC ..................................................... 345/1.1–3.4
See application file for complete search history.

(56) References Cited

U.S. PATENT DOCUMENTS

| | | | | |
|---|---|---|---|---|
| 5,805,117 | A * | 9/1998 | Mazurek et al. | 345/1.3 |
| 6,091,252 | A | 7/2000 | Akram et al. | |
| 6,242,932 | B1 | 6/2001 | Hembree | |
| 6,252,564 | B1 * | 6/2001 | Albert et al. | 345/1.3 |
| 6,498,592 | B1 | 12/2002 | Matthies | |
| 6,529,026 | B1 | 3/2003 | Farnworth et al. | |
| 7,091,927 | B1 * | 8/2006 | Hagge et al. | 345/1.3 |
| 7,342,571 | B2 | 3/2008 | Fraser et al. | |
| 7,592,970 | B2 | 9/2009 | Matthies et al. | |
| 7,859,521 | B2 | 12/2010 | Hotelling et al. | |
| 2002/0154259 | A1 * | 10/2002 | Freidhoff et al. | 349/73 |
| 2003/0071832 | A1 * | 4/2003 | Branson | 345/698 |
| 2004/0008155 | A1 * | 1/2004 | Cok | 345/1.3 |
| 2005/0102572 | A1 * | 5/2005 | Oberlaender | 714/29 |
| 2009/0310065 | A1 * | 12/2009 | Dunn | 349/69 |

* cited by examiner

*Primary Examiner* — Stephen Sherman
(74) *Attorney, Agent, or Firm* — Schwegman Lundberg & Woessner, P.A.

(57) ABSTRACT

Embodiments of systems and methods of seamless displays are generally described herein. In some embodiments, a backpanel device comprising display drive circuitry can be removably coupled with a display device via an array of contact members. The display device can include image-producing elements or pixels that can be selectively driven by the backpanel device via corresponding portions of the array of contact members. Multiple display devices can be disposed adjacently on one or more backpanel devices such that an image displayed across the multiple display devices appears seamless.

18 Claims, 11 Drawing Sheets

ARCHITECTURE FOR SEAMLESS INTEGRATED DISPLAY SYSTEM

TECHNICAL FIELD

Embodiments pertain to visual display systems. Some embodiments pertain to modular visual display systems.

BACKGROUND

Multi-screen visual displays can be created by arranging multiple discrete visual display devices adjacent to one another. For example, multiple liquid crystal display devices, electroluminescent display devices, LED display devices, or plasma display devices, among others, can be arranged to form a multi-screen system. One issue with multi-screen displays is that viewers can detect seams, or gaps in a displayed image, where adjacent video display devices meet. Another issue with multi-screen displays is that the size and shape of the visual display area is limited by the hardware of the individual video devices, making custom display areas costly. Often, video devices combined to form a multi-screen display are required to be of the same type (e.g., from the same manufacturer, of the same dimensions, etc.) in order to function together, and to minimize the appearance of seams between the devices. Yet another issue with multi-screen displays is the apportionment of image data among multiple display devices, each having different display drive circuits.

Thus there are needs for systems and methods that minimize the appearance of seams in images displayed across multiple display devices, needs for a dynamically adjustable display area, such as after an initial installation, and needs for simplifying the apportionment of image data among multiple display devices.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Various modifications to the embodiments will be readily apparent to those skilled in the art, and the generic principles defined herein may be applied to other embodiments and applications without departing from the scope of the invention. Moreover, in the following description, numerous details are set forth for the purpose of explanation. However, one of ordinary skill in the art will realize that embodiments of the invention may be practiced without the use of these specific details. In other instances, well-known structures and processes are not shown in block diagram form in order not to obscure the description of the embodiments of the invention with unnecessary detail. Thus, the present disclosure is not intended to be limited to the embodiments shown, but is to be accorded the widest scope consistent with the principles and features disclosed herein.

Figure 1:
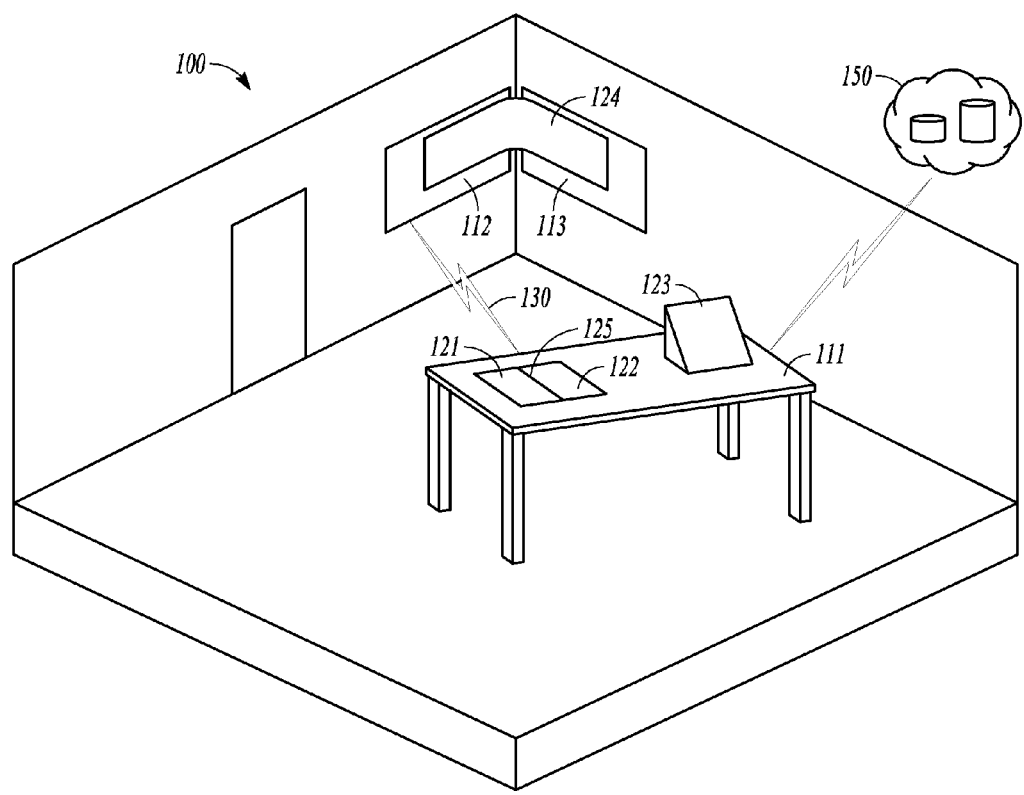
FIG. 1 illustrates generally display devices and corresponding backpanel devices according to some embodiments.

FIG. 1 illustrates generally an example 100 of display devices and backpanel devices according to some embodiments. In an embodiment, a display device can be fixedly or removably coupled with a backpanel device. A backpanel device can include display drive circuitry, such as including a video processing circuit, a memory circuit, one or more user interface circuits, or a wireless communication circuit, among others. A backpanel device can have an interconnect surface (e.g., a planar or curved surface) comprising multiple contact members (e.g., electrical or optical terminals or nodes). A display device can have a similar interconnect surface comprising multiple contact members, and the display device can be coupled to the backpanel device, such as along corresponding ones of the backpanel contact members and display device contact members. A display device can include pixels (e.g., discrete light-emitting or transmissive elements) that correspond to the display device contact members and, when coupled to a backpanel device, correspond to the backpanel device contact members. In some embodiments, a display device includes a touch-sensitive input surface or other human interface feature configured to receive information from a user.

The example 100 includes a first backpanel device 111, a second backpanel device 112, and a third backpanel device 113. The example 100 further includes a first display device 121, a second display device 122, a third display device 123, and a fourth display device 124. In the example 100, the first backpanel device 111 is disposed on or integrated with a top surface of a table. The first display device 121 can be coupled to a portion of the first backpanel device 111. In an example, the first backpanel device 111 and the first display device 121 can be used together to provide a visual display, such as after an initialization period involving an exchange or detection of display device parameter information by the first backpanel device 111. Once configured using the display device parameter information, display drive circuitry in the first backpanel device 111 can be used to drive pixels in the first display device 121, such as using image data exchanged from the first backpanel device 111 to the first display device 121.

Similarly, the second display device 122 can be detachably coupled to a portion of the first backpanel device 111, such as adjacent to the first display device 121. The second display device 122 can be similarly initialized, including an exchange or detection of display device parameter information between the second display device 122 and one or more of the first backpanel device 111 and the first display device 121. After initialization, image data can be exchanged from the first backpanel device 110 to the first and second display devices 121 and 122. In an example, the first and second display devices 121 and 122 can be disposed sufficiently near one another, and the side edges of the first and second display devices 121 and 122 can sufficiently engage or correspond, such that an image displayed across the boundary 125 between the first and second display devices 121 and 122 appears seamless to a viewer.

The third display device 123 can be coupled to a different portion of the first backpanel device 111, such as at the same time that the first and/or second display devices 121 and 122 are coupled to the first backpanel device 111. After initialization, the third display device 123 can be driven by a display driver circuit in the first backpanel device 111 to display an image, such as the same or a different image displayed (e.g., concurrently) using the first and second display devices 121 and 122. In an embodiment, the first backpanel device 111 can include multiple display drive circuits corresponding to different contact member regions of the device. In an example, the first, second, and third display devices 121, 122, and 123 can be communicatively coupled, such as wirelessly, or using a physical connection established via the contact members and internal bus of the first backpanel device 111.

Example 100 illustrates second and third backpanel devices 112 and 113, such as affixed to or incorporated in the walls of the illustrated environment. As shown, the second and third backpanel devices 112 and 113 can be disposed adjacent each other, such as on different walls. The fourth display device 124 can be coupled to one or both of the second and third backpanel devices 112 and 113. The fourth display device 124 can have a curved display portion or can be a flexible display device. In an example, display drive circuitry in one or both of the second and third backpanel devices 112 and 113 can be configured to drive the fourth display device 124. The first backpanel device can be communicatively coupled 130 (e.g., wirelessly) to the second and/or third backpanel devices 112 and 113.

In an embodiment, a backpanel device can be wirelessly coupled to a cloud-based computing system 150, such as using an RF communication circuit coupled to or integrated with the backpanel device. One or more display devices can be coupled to the backpanel device and used to access or view information from the cloud-based computing system. In an embodiment, a display device coupled to the backpanel device identifies a particular user or class of users, and the backpanel device wirelessly retrieves or interacts with information in the cloud-based computing system that corresponds to the particular user or class. In an embodiment, the backpanel device includes telephonic communication capabilities, such as via a cell-based service, a wired service, or VOIP. When a user's particular display device is coupled to the backpanel device, the backpanel device can be configured to use device parameter information corresponding to the user's particular display device to access the telephonic communication capabilities corresponding to the user's preferences, data plan or service provider.

Figure 2:
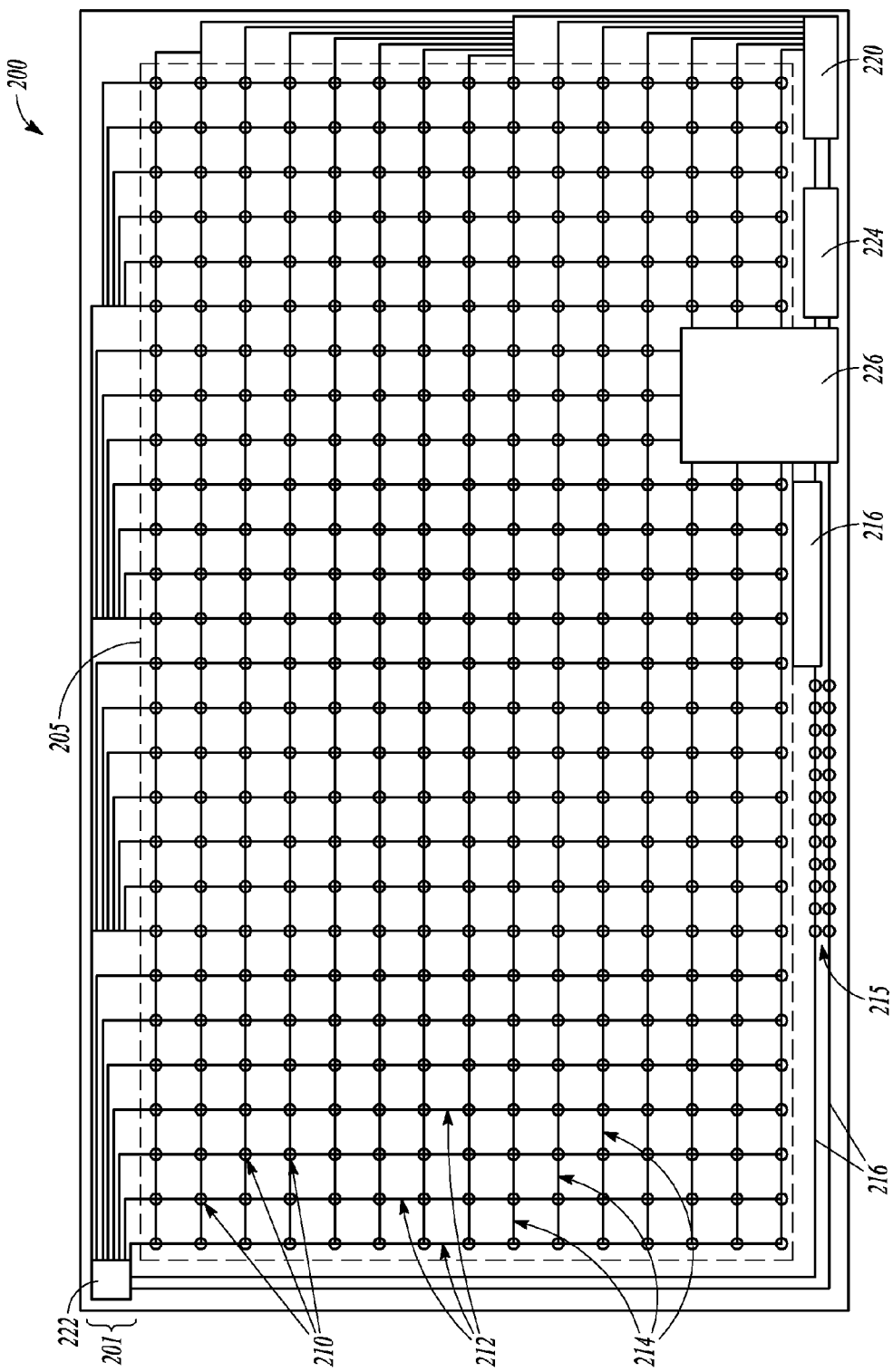
FIG. 2 illustrates a backpanel device configuration according to some embodiments.

FIG. 2 illustrates a backpanel device 200 according to some embodiments. The backpanel device 200 includes a backpanel interconnect portion 205 (shown enclosed by a dashed line) and an edge portion 201 between the backpanel interconnect portion 205 and an outer edge of the backpanel device 200. The backpanel device 200 includes an array of backpanel contact members 210. The array of backpanel contact members 210 can be distributed across a surface of the backpanel interconnect portion 205 according to a pattern, for example, a pattern having a regular pitch. For example, the array can include contact members that are uniformly distributed across the backpanel interconnect portion 205. In an embodiment, a horizontal inter-contact member spacing can be uniform, and a vertical inter-contact member spacing can be uniform. In some embodiments, inter-contact member horizontal and vertical spacing can be the same, such as illustrated in the example of FIG. 2.

Transmission lines can be coupled to one or more of the backpanel contact members 210. The transmission lines can be electrical or optical transmission lines that can carry data or other signals. In an embodiment, each contact member can be coupled to one or more vertical transmission lines 212 or horizontal transmission lines 214. In an embodiment, transmission lines coupled to the backpanel contact members 210 can extend to the edge portion 201 of the backpanel device 200. In an embodiment, transmission lines coupled to the backpanel contact members 210 can extend in other directions, such as toward a rear portion of the backpanel device 200 (e.g., behind the backpanel interconnect portion 205). Transmission lines coupled to elements other than or in addition to contact members can include busses 216. In an embodiment, transmission lines in the edge portion 201 of the backpanel device 200 can be stacked or otherwise combined or bundled to keep the edge portion 201 narrow. In an embodiment, the edge portion extends toward a rear side of the backpanel interconnection portion 205 such that transmission lines, processors, and other devices are disposed under the backpanel interconnect portion 205.

The backpanel device 200 can include other interconnect portions, including a peripheral interconnect portion 215. The peripheral interconnect portion 215 can include an array of contact members, such as can be arranged according to the same or different pitch as the contact members in the backpanel interconnect portion 205. The peripheral interconnect portion 215 can be configured to receive various electronic devices, such as display devices, display driver devices, SOC IC devices, or other devices or subcircuits usable with the backpanel device 200 or with a display device. Such other can be configured with an interconnect structure that corresponds to the contact members in the backpanel device 200. Accordingly, one or more devices can be directly attached to a backpanel or display device, such as using a chip-on-board (COB) or direct chip attachment (DCA) configuration.

The backpanel device 200 includes a display drive circuit 220. The display drive circuit 220 can be configured to provide display data or other information to a display device via the transmission lines and backpanel contact members 210. In an embodiment, the backpanel device 200 includes a sense circuit 222. The sense circuit 222 can be configured to receive information from a display device via the backpanel contact members 210 and transmission lines. For example, when a touch-sensitive display device is coupled to the backpanel device 200, user input information received from the touch-sensitive display can be received via the backpanel contact members 210 and the vertical or horizontal transmission lines 212 or 214 using the sense circuit 222. In an embodiment, the sense circuit 222 can be coupled to a subset of the backpanel contact members 210.

In an embodiment, the backpanel device 200 includes an RF transceiver 224 and an antenna. The RF transceiver 224 can be configured to wirelessly receive and transmit data, such as including display data, user information data, initialization data, or other data. In an embodiment, the RF transceiver 224 can be coupled to the display drive circuit 220. Data received via the RF transceiver 224 can be processed using the display drive circuit 220 and distributed to an appropriate subset of the backpanel contact members 210 (e.g., a subset corresponding to a display device coupled to the backpanel device 200).

In an embodiment, the backpanel device 200 includes a processor circuit 226. The processor circuit 226 can be configured to monitor or control one or more functions of the backpanel device 200 or a display device coupled to the backpanel device 200. For example, the processor circuit 226 can receive and interpret information from the sense circuit 222, and in response, display information using the display drive circuit 220.

In an embodiment, the display drive circuit 220, sense circuit 222, RF transceiver 224, processor circuit 226, or other device, such as a volatile or non-volatile memory circuit, can be integrated with the backpanel device 200, or can be coupleable to the backpanel device, such as via the backpanel contact members 210 or the contact members in the peripheral interconnect portion 215. For example, the RF transceiver 224 can be a stand-alone transceiver circuit having contact members correspondingly arranged to the contact members in the peripheral interconnect portion 215. One or more of the busses 216 can electrically or optically connect the peripheral devices.

Figure 3:
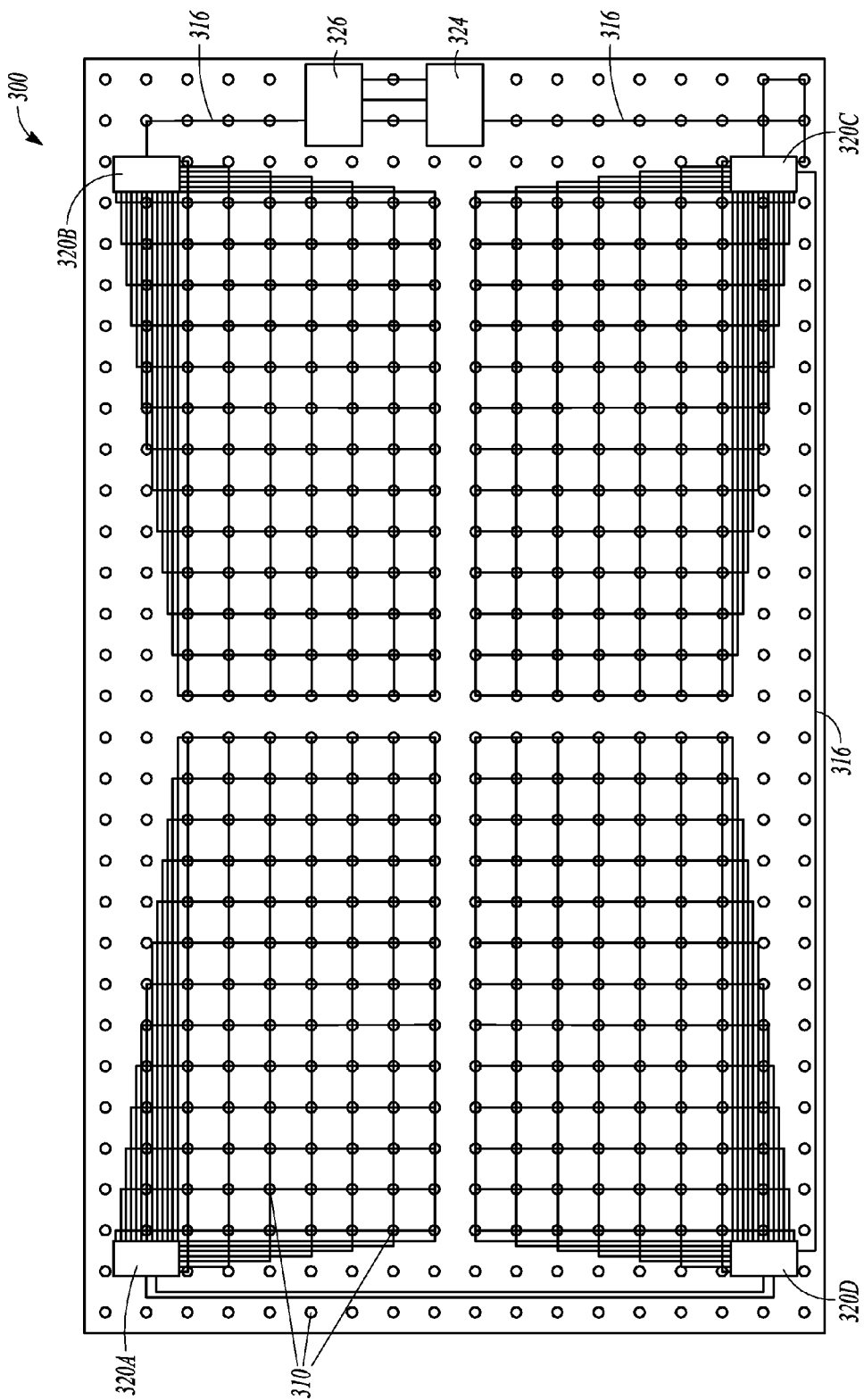
FIG. 3 illustrates a backpanel device configuration according to some embodiments.

FIG. 3 illustrates a backpanel device 300 according to some embodiments. The backpanel device 300 includes a backpanel interconnect portion having an array of backpanel contact members 310. The array can include contact members that are uniformly distributed across substantially all of the backpanel device 300. In some examples, the contact members can be non-uniformly distributed. The backpanel device 300 can be functionally divided into different regions. For example, each region can include a subset of the backpanel contact members 310, and a corresponding display drive/sense circuit 320A, 320B, 320C, and 320D.

The backpanel device 300 can include one or more global devices, such as a global processor circuit 326 and a global RF transceiver circuit 324. As shown in the example of FIG. 3, such global devices can be disposed in an edge portion of the backpanel device 300; however, global devices can be disposed behind or integrated with the display interconnect region of the backpanel device 300, such as to minimize a width of the edge portion. The global devices can be configured to communicate with and/or control the functional regions of the backpanel device 300. For example, data wirelessly received via the global RF transceiver circuit 324 can be processed by the global processor circuit 326 and distributed to one or more of the display drive/sense circuits 320A, 320B, 320C, and 320D. Bus or transmission lines 316 can be used to communicatively couple the different functional regions of the backpanel device 300.

Figure 4A:
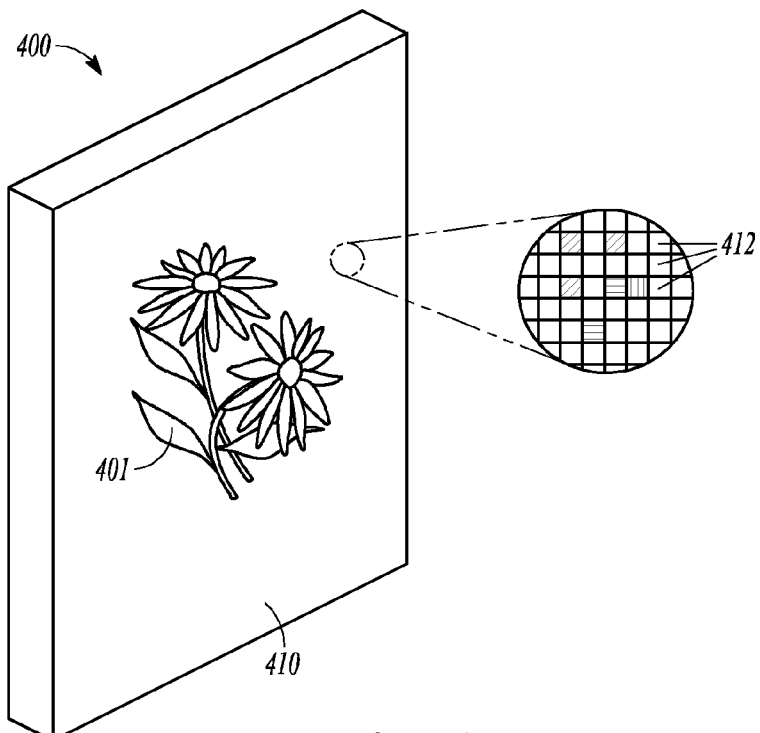
FIG. 4A illustrates a display surface of a display device according to some embodiments.
Figure 4B:
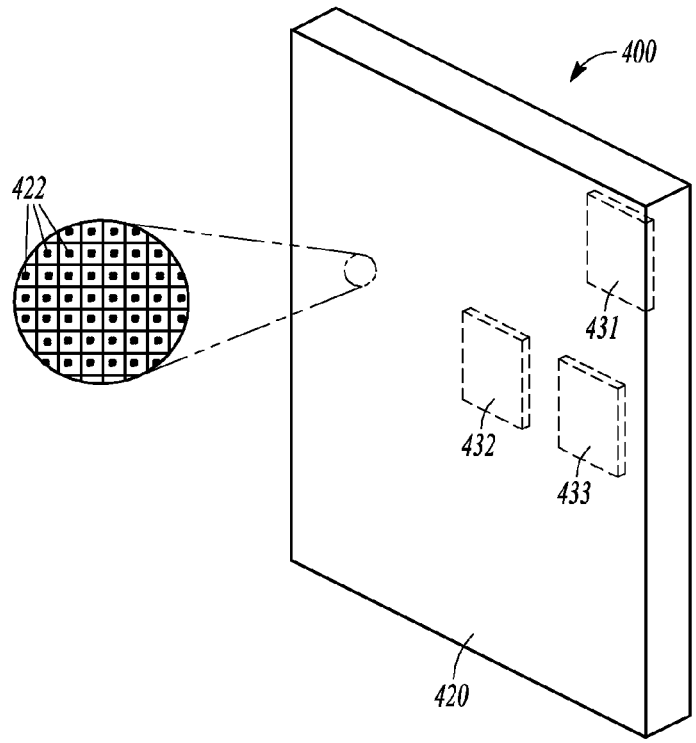
FIG. 4B illustrates an interconnect surface of a display device according to some embodiments.

FIGS. 4A and 4B illustrate a display device 400 according to some embodiments. FIG. 4A illustrates a display surface 410 of the display device 400. The display surface 410 includes multiple pixels 412 that can be selectively activated to produce an image 401 visible to a user. In an embodiment, the pixels 412 are LED, LCD, plasma, film, or other discrete light-emitting or transmissive elements. In an embodiment, the display surface 410 includes an touch-sensitive input surface configured to receive touch-based input signals (e.g., sensed electrical signals) from a user.

FIG. 4B illustrates an interconnection surface 420 of the display device 400. The interconnection surface 420 includes multiple contact members 422. In an embodiment, the multiple contact members 422 correspond to the multiple pixels 412. For example, each of the contact members 422 can correspond to a unique one of the multiple pixels 412. In an embodiment, one of the contact members 422 can correspond to more than one pixel, or multiple contact members 422 can correspond to one of the pixels 412. For example, a single pixel can correspond to at least three contact members where each of the three contact members corresponds to a red, green, or blue color component signal. The multiple pixels 412 and their corresponding multiple contact members 422 can be distributed across substantially all of the display device interconnection surface 420 (e.g., extending to the extents of the display device 400). In an embodiment, at least a portion of the multiple contact members 422 and multiple pixels 412 can be disposed along an edge portion of the display device 400.

The display device 400 can include one or more embedded elements or devices 431, 432, 433. In an example, the embedded elements or devices 431, 432, or 433 can include, among other things, an RFID tag, RF transceiver, processor circuit, memory circuit, sense circuit, or display drive circuit (e.g., video processing circuit). In an embodiment, the display device 400 can be coupled to a backpanel device, and the embedded device 431 can include an RFID tag readable by an RF transceiver (e.g., the RF transceiver 224) in the backpanel device. The RFID tag can include user-related or device-related parameter information that can be exchanged from the RFID tag to the backpanel device via the transceiver. In an example, the embedded element 432 can include a sense circuit configured to receive operating power from a backpanel device and to sense user input commands provided to a touch-sensitive portion of the display device 400.

Figure 5A:
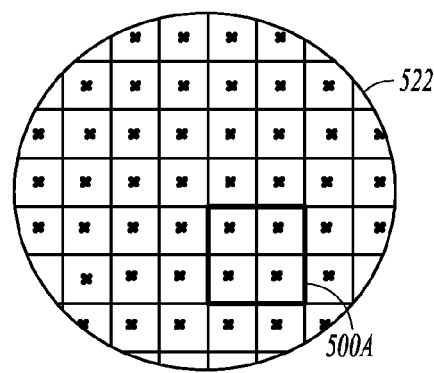
FIGS. 5A-5G illustrate generally contact members according to some embodiments.

FIG. 5A illustrates generally multiple contact members 522, such as the multiple contact members 422 of the display device 400, or the backpanel contact members 210 or 310 of the backpanel devices 200 or 300, respectively. A subset of adjacent contact members 500A is highlighted for further discussion. The multiple contact members 522 can be attached to or integrated with a display device or backpanel device. For example, contact members can include projection members that extend away from a substrate of one of a backpanel device or display device, or recess members that extend inward from a substrate surface of one of a backpanel device or display device. The contact members can include, among others, electrically conductive or optically transmissive members, such as can be formed in part using a stenciling, screen printing, depositing, selective etching, or a laminating process. Contact members can have different geometries or configurations, some examples of which are illustrated in FIGS. 5B-5G.

Figure 5B:
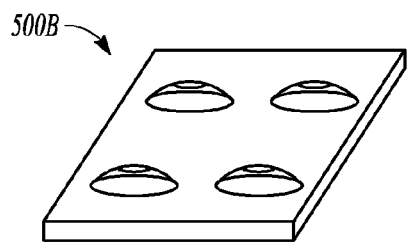
Figure 5C:
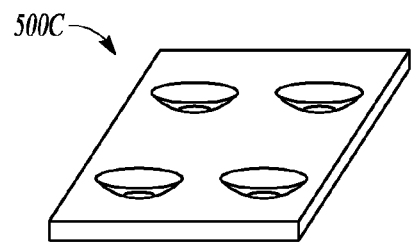

FIGS. 5B and 5C illustrate generally examples of corresponding contact members. For example, FIG. 5B illustrates contact members 500B comprising raised contact members or "bumps." Such bumps can be formed as solder bumps, bumps of a conductive polymer, or other raised features on or coupled to a substrate. FIG. 5C illustrates contact members 500C comprising recess members that can physically correspond to the bumps, or projection contact members 500B.

Figure 5D:
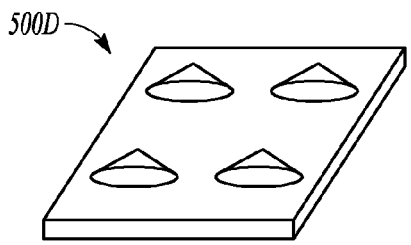
Figure 5E:
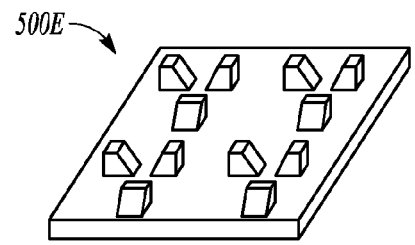

FIGS. 5D and 5E illustrate generally examples of corresponding contact members. For example, FIG. 5D illustrates contact members 500D comprising cone-shaped contact members having a "sharp" top edge. In some embodiments, debris or other native oxide layers can form on the contact members. Contact members with a sharp edge can be used to penetrate such layers to facilitate a usable electrical connection. FIG. 5E illustrates contact members 500E comprising raised portions (e.g., two or more raised portions) configured to receive corresponding ones of the cone-shaped contact members 500D. The contact members 500E can be rounded bumps, rectangular projections, or other raised features, such as having one or more surfaces corresponding to the slanted surfaces of the cone-shaped contact members 500D.

In an embodiment, recessed contact members can retain corresponding projection contact members. For example, one or both of projection or recess contact members can be formed using a mechanically compliant or compressible material, such as a conductive silicon polymer. A projection contact member can optionally have a retaining ridge that extends radially away from an axis of the projection member. A recessed contact member can be configured to receive and retain the projection contact member, such as using a detent that deflects or receives the retaining ridge. In an embodiment, a retention force provided by corresponding recess and projection contact members can sufficiently retain a display device against a backpanel device, such as when the devices are disposed vertically on a wall.

Figure 5F:
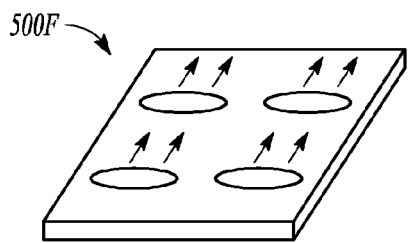
Figure 5G:
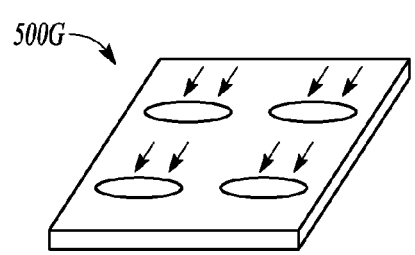

FIGS. 5F and 5G illustrate generally examples of corresponding contact members. For example, FIG. 5F illustrates contact members 500F comprising light emitting contact members, such as LEDs or other elements configured to illuminate an optical channel. FIG. 5G illustrates contact members 500G comprising light sensing contact members configured to sense a light signal provided by corresponding light emitting contact members.

In an embodiment, a processor circuit disposed in one or both of a backpanel device or a corresponding display device can recognize a contact member "dead zone" where corresponding contact members on the backpanel device and display device are expected to be in electrical or optical communication but fail to be, such as due to missing or broken contact members, contact member oxidation, or debris between the devices. The processor circuit can attempt to re-route data signals using nearby contact members and transmission lines to avoid an interrupted visual display.

Figure 6A:
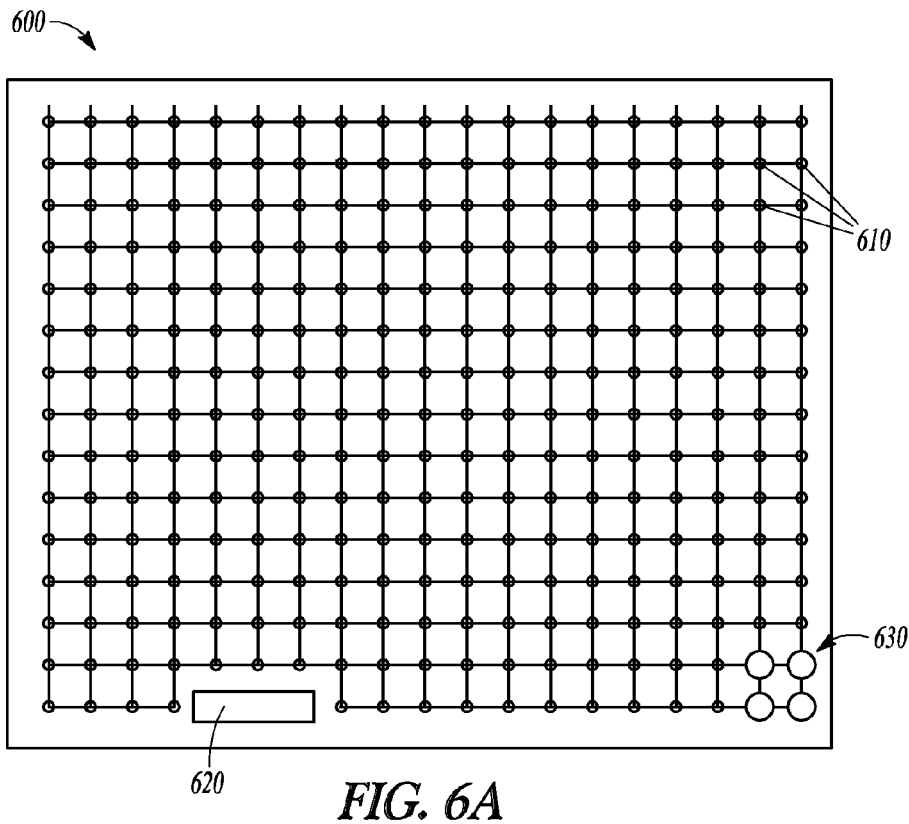
FIG. 6A illustrates generally an example of an alignment feature of a backpanel device according to some embodiments.
Figure 6B:
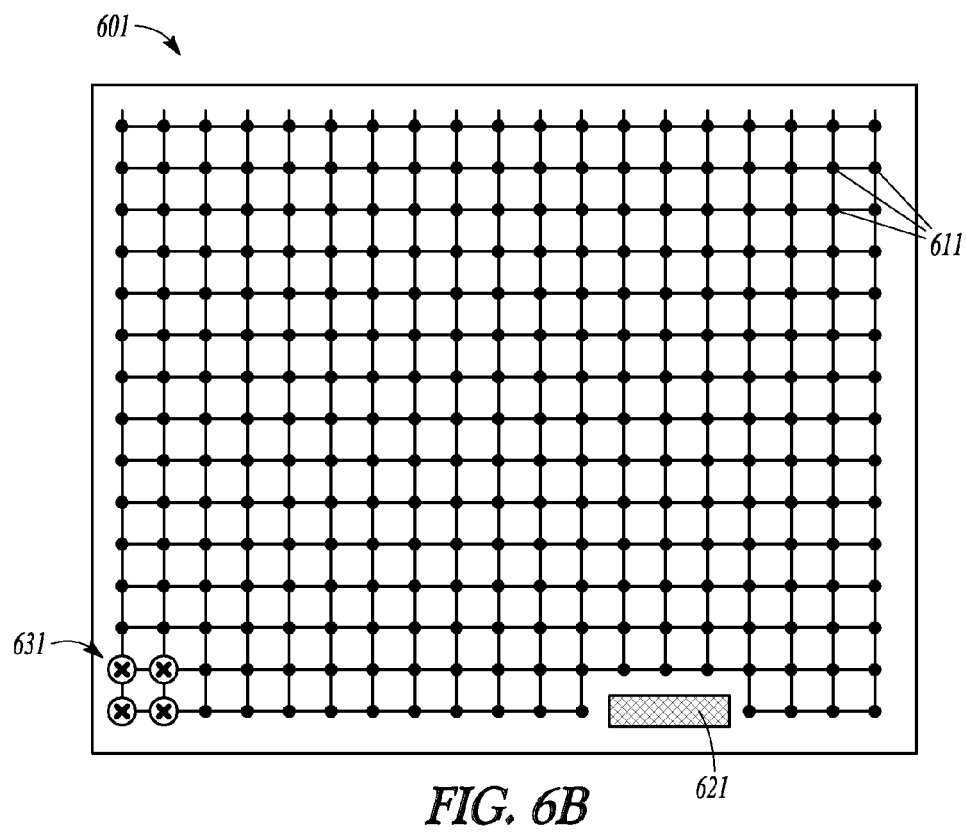
FIG. 6B illustrates generally an example of an alignment feature of a display device according to some embodiments.

FIG. 6A illustrates generally an example of an alignment feature of a backpanel device 600 according to some embodiments, and FIG. 6B illustrates generally an example of an alignment feature of a display device 601. The backpanel device 600 includes an array of backpanel contact members 610, and the display device 601 includes an array of display contact members 611. The contact members can have the same pitch such that the backpanel contact members 610 can matingly engage with the display contact members 611 when the backpanel device 600 is coupled to the display device 601. In an embodiment, an alignment feature can be used to encourage the backpanel device 600 and the display device 601 to align such that the corresponding contact members form a functional communication channel (e.g., an electrical or optical connection).

The backpanel device 600 includes a first alignment feature 620. The first alignment feature 620 can be a raised or recessed mechanical feature, such as a raised rectangular post. The display device 601 includes a second alignment feature 621. The second alignment feature 621 can similarly be a raised or recessed mechanical feature, such as a rectangular recess. In an embodiment, the first alignment feature 620 can matingly engage with the second alignment feature 621. Multiple alignment features can be disposed on the backpanel device 600 and the display device 601, such as near the edges of the devices.

The backpanel device 600 includes a third alignment feature 630. The third alignment feature 630 can include a portion of the array of backpanel contact members 610, such as including one or more contact members having a different pitch or size than the other contact members. For example, the contact members inside the third alignment feature 630 portion of the array can be larger, smaller, or otherwise differently shaped or distributed than the contact members outside the third alignment feature 630 portion. In the illustrated embodiment, the third alignment feature 630 includes four contact members that are larger than the other contact members in the array but that maintain the same pitch, or center-to-center distribution. A fourth alignment feature 631 in the display device 601 can be configured to correspondingly engage with the third alignment feature 630.

In an embodiment, the third and fourth alignment features 630 and 631 can include contact members having special designated functions in addition to or other than physical device alignment and data transmission. One or more of the contact members in the third and fourth alignment features 630 and 631 can be power or ground nodes, such as coupling a power supply in the backpanel device 600 to the display device 601, or vice versa. One or more of the contact members in the third and fourth alignment features 630 and 631 can be a bulk data node configured to exchange image or non-image related data between the devices. For example, device parameter information can be exchanged using the contact members in the alignment features, such as instead of or in addition to using the contact members 610 and 611.

In an embodiment, a mechanism can be provided on one or both of a backpanel device or a display device to mechanically bias an array of backpanel contact members toward or against an array of display contact members. For example, the mechanism can be a clamp-type feature.

Figure 7A:
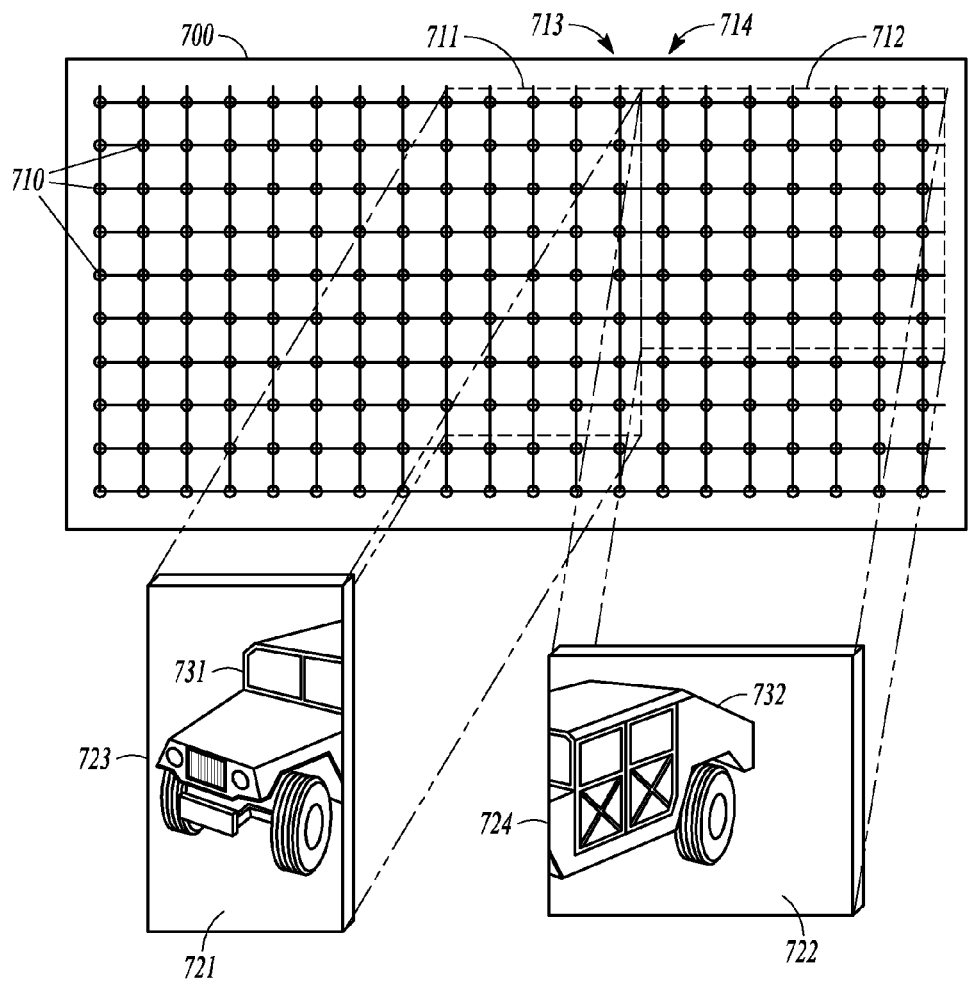
FIGS. 7A and 7B illustrate using multiple display devices according to some embodiments.
Figure 7B:
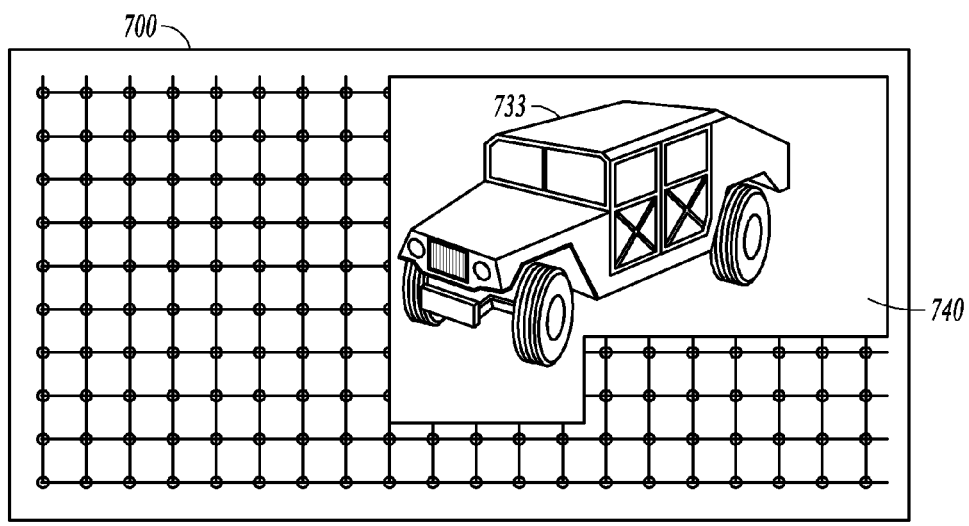

FIGS. 7A and 7B illustrate using multiple display devices according to some embodiments. A backpanel device 700 having an array of backpanel contact members 710 can be coupled to a first display device 721 and a second display device 722. The first and second display devices 721 and 722 can be coupled to first and second portions 711 and 712, respectively, of the array of backpanel contact members 710.

The first and second portions 711 and 712 of the array can be adjacent to each other. For example, when the first display device 721 is coupled to the first portion 711 of the array of backpanel contact members 710, display device contact members disposed along an edge portion 723 of the first display device 721 can correspondingly engage with a first column 713 of the array of backpanel contact members 710. When the second display device 722 is coupled to the second portion 712 of the array of backpanel contact members 710, display device contact members disposed along an edge portion 724 of the second display device 722 can correspondingly engage with a second column 714 of the array of backpanel contact members 710. The first and second columns 713 and 714 can be adjacent columns of contact members in the backpanel device 700. Accordingly, when the first and second display devices 721 and 722 are used to concurrently display first and second portions 731 and 732 of an image, the image can appear seamless across the boundary between the first and second display devices 721 and 722. For example, in the embodiment of FIG. 7B, the first and second display devices 721 and 722 can appear to be a single seamless display device 740 displaying a continuous image 733 when the display devices are coupled to adjacent portions of the backpanel device 700.

Figure 8:
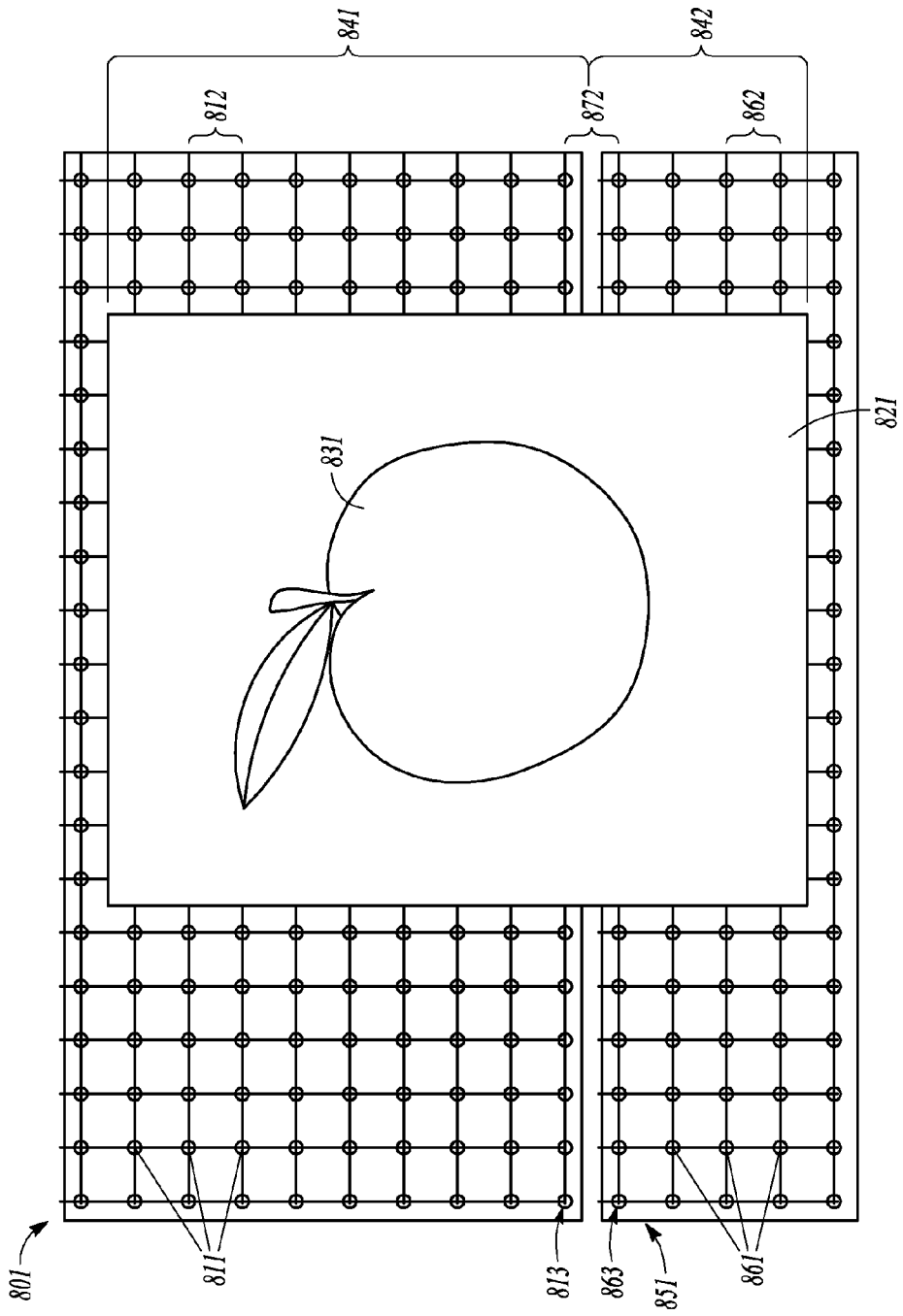
FIG. 8 illustrates using multiple backpanel devices according to some embodiments.

FIG. 8 illustrates using multiple backpanel devices according to some embodiments. In an embodiment, a display device 821 can be coupled to first and second backpanel devices 801 and 851. The first and second backpanel devices 801 and 851 can have first and second arrays 811 and 861, respectively, of backpanel contact members, such has having the same shape and pitch. That is, an inter-member spacing 812 of the first array 811 of backpanel contact members can be the same as an inter-member spacing 862 of the second array 861 of backpanel contact members.

In an embodiment, the first and second backpanel devices 801 and 851 can be disposed adjacent to each other. Accordingly, an inter-member spacing 872 between adjacent rows of contact members in different backpanel devices can be the same as the inter-member spacings 812 and 862 of the first and second arrays. For example, an inter-member spacing 872 between an edge row 813 of the first array of backpanel contact members 811 and an edge row 863 of the second array 861 of backpanel contact members can be the same as the inter-member spacings 812 and 862. In such an embodiment, the display device 821 can be operatively coupled to the first and second backpanel devices 801 and 851. The display device 821 can be driven by one or both of the first and second backpanel devices 801 and 851, such as using display device drive circuits disposed in one or both of the backpanel devices. In an embodiment, a display drive circuit disposed in the first backpanel device 801 is configured to drive all of the pixels in the display device 821. In an embodiment, a display drive circuit disposed in the first backpanel device 801 is configured to drive a first portion 841 of the display device 821, and a display drive circuit disposed in the second backpanel device 851 is configured to drive a second portion 842 of the display device 821. In either case, an image 831 can appear seamless on the display device 821. In an embodiment, multiple display devices can be disposed on multiple backpanel devices, such as by combining the embodiments illustrated in FIGS. 7A, 7B, and 8.

Figure 9A:
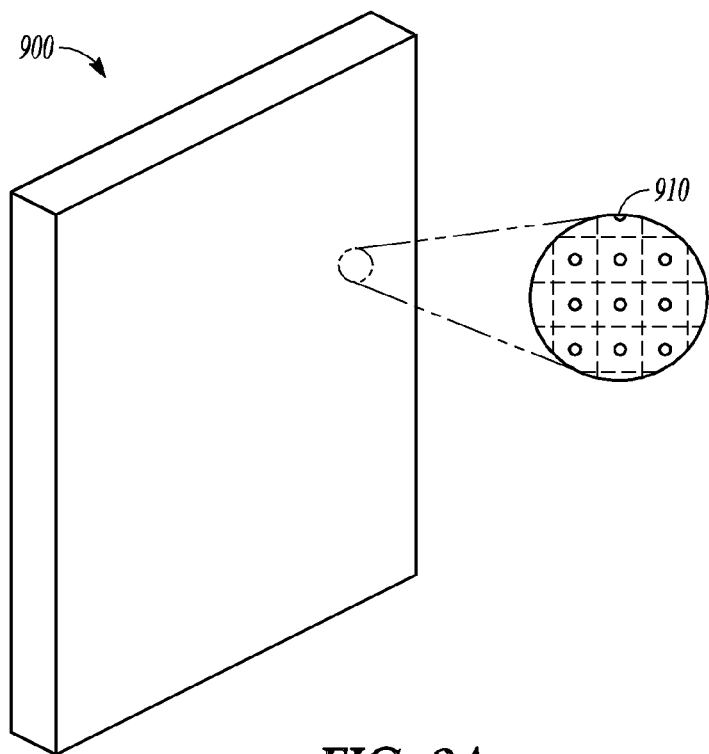
FIGS. 9A and 9B illustrate an interposing member according to some embodiments.
Figure 9B:
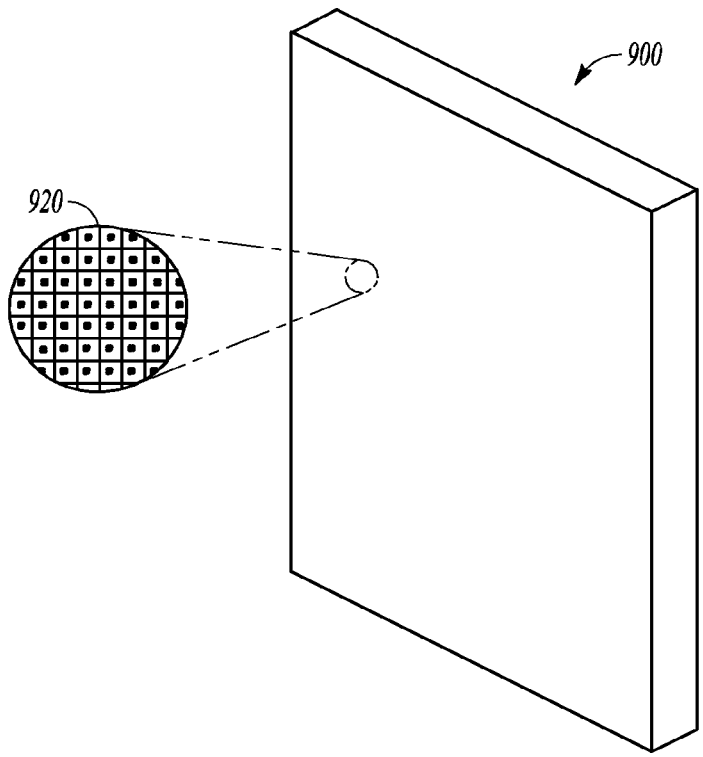

FIGS. 9A and 9B illustrate an interposing member 900 according to some embodiments. The interposing member 900 can be configured to interface with a backpanel device having a first array of contact members and a display device having a different second array of contact members. In an embodiment, the interposing member 900 can include a first side having a first array of contact members 910 with a first shape and pitch (FIG. 9A). The interposing member 900 can include a second side having a second array of contact members 920 with a different second shape and pitch (FIG. 9B). The first and second arrays of contact members 910 and 920 can be internally coupled in the interposing member 900, such as electrically or optically via transmission or bus lines. In an embodiment, each of the contact members 910 in the first array can be coupled with a corresponding one of the contact members 920 in the second array. In an embodiment, there can be a different quantity of contact members in the first and second arrays such that one or more contact members 910 in the first array are coupled to one or more contact members 920 in the second array. In an embodiment, not all contact members 910 and 920 are coupled.

In an embodiment, the interposing member 900 can include a processor circuit configured to receive a data signal from one of the first and second arrays of contact members 910 and 920, and provide a modified data signal to the other of the first and second arrays. For example, the interposing member 900 can be configured to receive image data having a first resolution from a backpanel device using the first array of contact members 910, alter the image data to a second resolution using a processor circuit inside the interposing member 900, and provide the altered image data to a display device that supports the second resolution using the second array of contact members 920.

In an embodiment, the first and second arrays of contact members 910 and 920 can include contact members of different sizes, shapes, or types. For example, electrical contact members can be disposed on one side and optical contact members can be disposed on another. In an embodiment, the interposing member 900 can have more than two sides with contact members. For example, an interposing member can be a cube-shaped member having different contact members on the six different sides of the cube.

In an embodiment, a backpanel device can have a first array of contact members having a first shape and pitch. For example, the backpanel device can have a first array of contact members comprising raised contact members or bumps, such as shown in the embodiment of FIG. 5B. A display device can have a second array of contact members having a different second shape and pitch. For example, the display device can have a second array of contact members comprising raised contact members or bumps, such as according to a variation of the embodiment shown in FIG. 5B, and having a different shape and pitch than the contact members in the first array on the backpanel device. Accordingly, to be usable together, the interposing member 900 can be used to couple the backpanel device having the first array of bumps and the display device having the second array of bumps. That is, the interposing member can have a first array of recess contact members corresponding to the first array of contact member bumps, and a second array of recess contact members corresponding to the second array of contact member bumps.

Figure 10:
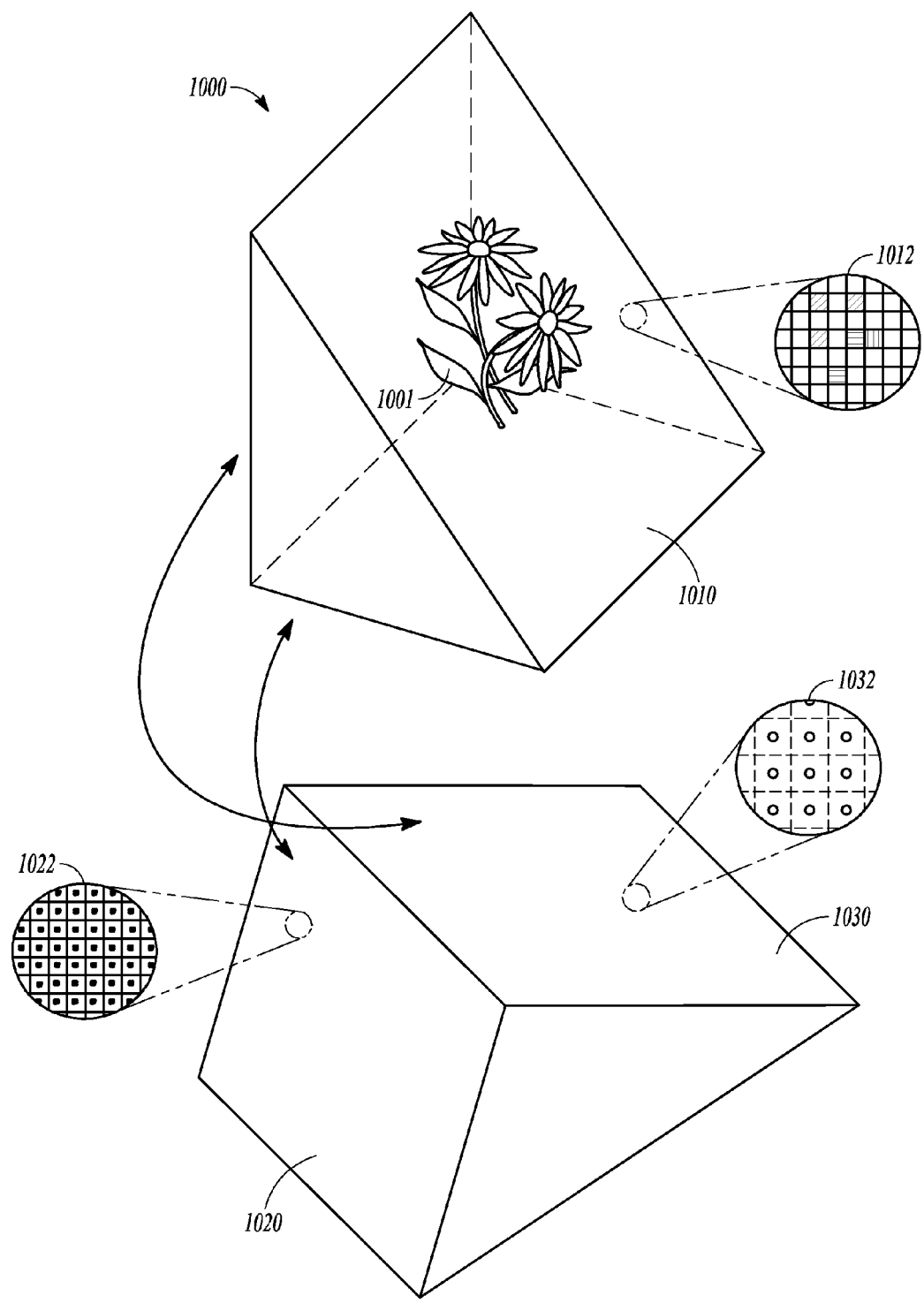
FIG. 10 illustrates a display device according to some embodiments.

FIG. 10 illustrates a display device 1000 according to some embodiments. The display device 1000 includes a display surface 1010. The display surface 1010 includes multiple pixels 1012 that can be selectively used to produce a visible image 1001, such as according to the discussion of the display device 400, above.

The multiple pixels 1012 can be coupled to contact members on more than one surface of the display device 1000, for example, on adjacent first and second display contact member surfaces 1020 and 1030. The first contact member surface 1020 can include a first array 1022 of contact members having a first shape and pitch. The second contact member surface 1030 can include a second array 1032 of contact members having a different second shape and pitch. Thus, the display device 1000 can be coupled to one or more backpanel devices having at least two different arrays of backpanel contact members. In an embodiment, the display device 1000 can be disposed on a top surface of a backpanel device, such as illustrated by the third display device 125 in the example 100.

Figure 11:
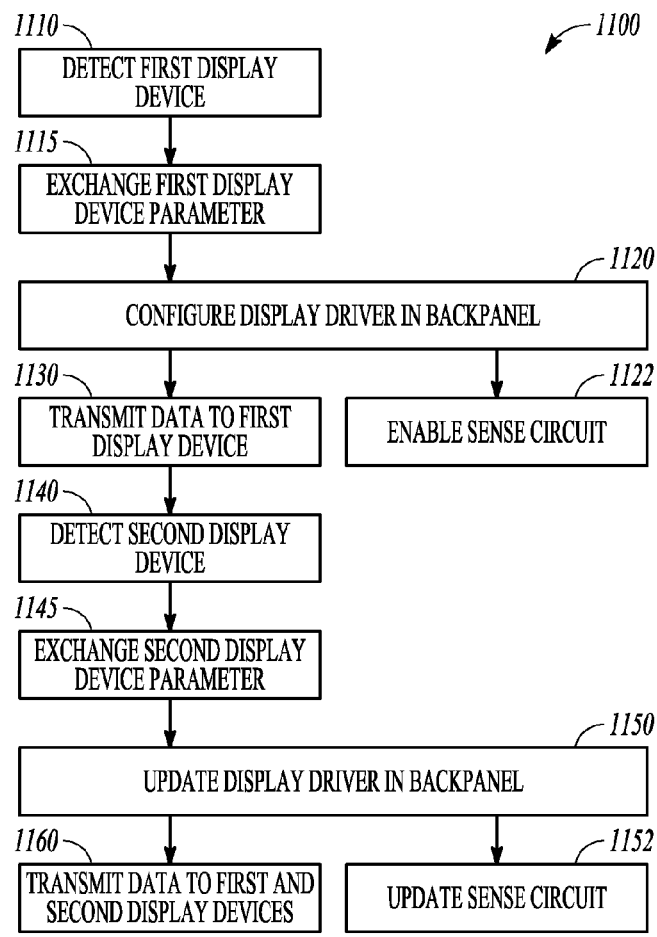
FIG. 11 illustrates generally an example of configuring a backpanel device to use multiple display devices according to some embodiments.

FIG. 11 illustrates generally an example 1100 of configuring a backpanel device to use multiple display devices according to some embodiments. At 1110, a first display device can be detected, such as using a backpanel device. The first display device can be detected when it physically contacts the backpanel device, such as using corresponding contact members on the first display device and the backpanel device. In an embodiment, the first display device can be detected when it is proximal to the backpanel device, such as by wirelessly exchanging a data packet (e.g., an RFID tag).

At 1115, a first display device parameter corresponding to the first display device can be exchanged between the first display device and the backpanel device. The first display device parameter can include a configuration or identification parameter, such as including information about a display dimension, resolution, display element type, power or data format requirement, communication protocol, or user identification, among other information. The first display device parameter can include a security token or other authorization information. In an embodiment, the first display device parameter is stored in a memory circuit of the display device, and the parameter can be used (e.g., by a backpanel device) to configure, control, or format a data stream provided to the display device.

Referring to the example of FIG. 1, the first backpanel device 110 and the first display device 121 can be initialized when the first display device 121 is coupled to the first backpanel device 110, such as by exchanging display device parameter information between the devices. For example, the display device parameter information can include information sensed by the first backpanel device 110 about the size of the first display device 121 (e.g., using corresponding contact members). The display device parameter information can be a data packet (e.g., an RFID code or other electronic data code) exchanged from the first display device 121 to the first backpanel device 110.

Returning to FIG. 11, at 1120, in response to receiving the first display device parameter, a display driver can be configured in the backpanel device. For example, an array of backpanel contact members corresponding to display contact members on the first display device can be enabled, or a power node can be activated to enable a power node on one or both of the backpanel device and the first display device. The display driver can be configured to drive a particular type of display device (e.g., the first display device), such as having a particular type or number of contact members or display elements, using the received first display device parameter. In the example of FIG. 1, once the first backpanel device 110 receives and interprets the display device parameter information, display drive circuitry in the first backpanel device 110 can be configured to drive the first display device 121.

At 1122, a sense circuit can optionally be enabled in one or more of the backpanel device or the first display device. For example, when the first display device parameter indicates that the first display device is a touch-sensitive display device, a sense circuit in the backpanel device can be enabled and configured to interface with touch-sensitive input circuitry in the display device, such as described above in the example of FIG. 4A.

At 1130, data can be transmitted to the first display device. The data can include image data, configuration data, or other data, such as can be stored in a memory circuit or used by a processor circuit in the first display device. The data can be transmitted to the first display device from the backpanel device using corresponding pairs of contact members. In an embodiment, the transmitted data can include image data that can be used by pixel elements, corresponding to various backpanel and display device contact members, in the first display device to produce a visible image.

At 1140, a second display device can be detected, such as using the same backpanel device used to detect the first display device. The second display device can be detected physically or wirelessly, such as described above. At 1145, a second display device parameter corresponding to the second display device can be exchanged between the second display device and one or more of the first display device and the backpanel device, such as described above at 1115.

At 1150, in response to receiving the second display device parameter, a display driver in the backpanel device can be updated, such as according to the discussion at 1120, above. In an embodiment, an array of backpanel contact members corresponding to display contact members on the second display device can be enabled, or a power node can be activated to enable a power node on one or both of the backpanel device and the second display device.

At 1152, a sense circuit can optionally be enabled in one or more of the backpanel device or the second display device. At 1160, data can be transmitted to the second display device. In an embodiment, data can be transmitted to each of the first and second display devices concurrently, such as to display different portions of an image using the first and second display devices. The first and second display devices can optionally be disposed adjacent to each other to produce a seamless image, or they can be disposed apart.

In an embodiment, the first display device can display an image using the data transmitted to the first display device at 1130. Subsequently, the second display device can be detected at 1140. In response to detecting the second display device, the backpanel display driver can be updated at 1150, and the image can be automatically adjusted to display across portions of the first and second display devices, such as when the devices are disposed adjacent to one another.

Figure 12:
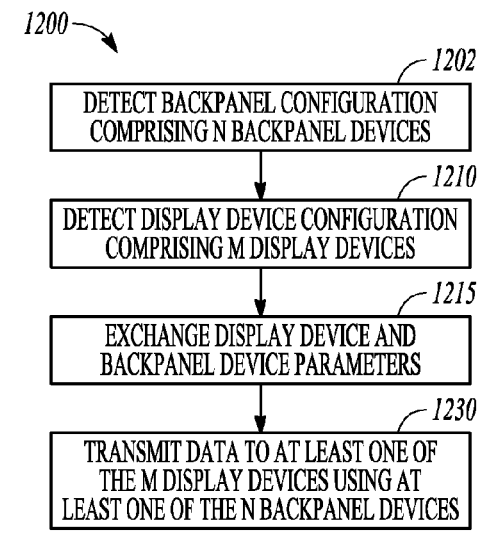
FIG. 12 illustrates generally an example of configuring multiple backpanel devices according to some embodiments.

FIG. 12 illustrates generally an example 1200 of configuring multiple backpanel devices according to some embodiments. At 1202, a backpanel configuration can be detected. The backpanel device configuration can include N backpanel devices, such as arranged adjacent to one another (see, e.g., adjacent first and second backpanel devices 801 and 851 in FIG. 8). The backpanel configuration can be detected automatically, such as by physically coupling the N backpanel devices, or by placing the N backpanel devices sufficiently near one another such that they can communicate using respective wireless transceivers (e.g., using RF, ultrasound, etc.).

At 1210, a display device configuration can be detected. The display device configuration can include M display devices, such as arranged adjacent to or apart from one another (see, e.g., adjacent first and second display devices 721 and 722 in FIGS. 7A and 7B). The display device configuration can be detected automatically, such as by physically coupling the M display devices to one or more of the N backpanel devices, or by placing the M display devices sufficiently near respective backpanel devices such that they can be communicatively coupled to exchange device parameters.

At 1215, display device and backpanel device parameters can be exchanged among the N backpanel devices and M display devices. For example, a display device parameter corresponding to a first one of the M display devices can be exchanged with first and second ones of the N backpanel devices. Accordingly, at 1230, the display device parameter can be used by the first and second ones of the N backpanel devices to transmit data to the first one of the M display devices. Each display device and/or backpanel device can undergo a similar initialization process including an exchange of device parameter information.

Embodiments may be implemented in one or a combination of hardware, firmware and software. Embodiments may also be implemented as instructions stored on a computer-readable storage device, which may be read and executed by at least one processor to perform the operations described herein. A computer-readable storage device may include any non-transitory mechanism for storing information in a form readable by a machine (e.g., a computer). For example, a computer-readable storage device may include read-only memory (ROM), random-access memory (RAM), magnetic disk storage media, optical storage media, flash-memory devices, and other storage devices and media. In some embodiments, one or more processor circuits may be configured with instructions stored on a computer-readable storage device.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. A display system comprising:
a backpanel device having a side edge portion and having an adjacent backpanel interconnect portion that is bordered at least in part by the side edge portion, wherein the backpanel interconnect portion includes an array of backpanel contact members, the backpanel contact members having corresponding conductors that extend into the side edge portion of the backpanel device;
a display device including a display surface and an interconnection surface, wherein the interconnection surface includes an array of display contact members that corresponds to the array of backpanel contact members;
a sense circuit disposed on the backpanel device and configured to receive parameter information from the display device when the display contact members are coupled with the backpanel contact members; and
a display drive circuit disposed on the side edge portion of the backpanel device, wherein the display drive circuit is configured to communicate with the display device based on the parameter information received from the sense circuit about the display device;
wherein the conductors in the backpanel device extend across at least a portion of the backpanel interconnect portion of the backpanel device to couple the backpanel contact members with the display drive circuit;
wherein the array of display contact members are removably coupleable with the array of backpanel contact members such that the display device is removably coupleable with the backpanel device by a user.

2. The display system of claim 1, wherein the display device is a light-emitting display device, and wherein the display surface is opposite the interconnection surface.

3. The display system of claim 1, wherein the display device comprises an array of pixels, and wherein each of the pixels corresponds to a unique one of the display contact members.

4. The display system of claim 1, wherein the display device comprises a touch-sensitive input region of the display surface.

5. The display system of claim 4, wherein at least one of the backpanel device or the display device comprises a processor circuit that is configured to receive a user input from the touch-sensitive input region of the display surface.

6. The display system of claim 1, comprising an SOC IC device that includes an interconnection array of contact members that corresponds to at least one of the array of backpanel contact members or the array of display contact members.

7. The display system of claim 6, wherein the SOC IC device is selected from the group consisting of an RF transceiver circuit, a processor circuit, a display driver circuit, and a memory circuit.

8. The display system of claim 1, wherein one of the array of backpanel contact members or the array of display contact members comprises electrically conductive portions of projection members that extend away from a substrate of the respective backpanel device or display device, and wherein the other one of the array of backpanel contact members or the array of display contact members comprises electrically conductive portions of recess members configured to receive and electrically contact corresponding electrically conductive portions of the projection members.

9. The display system of claim 8, wherein the array of contact members that comprises the projection members comprises a sharp edge on one or more of the contact members for penetrating a native oxide layer formed on the array that comprises the recess members.

10. The display system of claim 8, wherein the electrically conductive recess members are configured to retain corresponding electrically conductive projection members.

11. The display system of claim 8, wherein the electrically conductive projection members or the electrically conductive recess members are mechanically compliant.

12. The display system of claim 1, wherein the backpanel device comprises a mating alignment feature, and wherein the display device comprises a corresponding mating alignment feature.

13. The display system of claim 1, comprising first and second display devices, wherein the display contact members corresponding to the first display device are removably coupleable with a first subset of the backpanel contact members in the backpanel device, and the display contact members corresponding to the second display device are removably coupleable with a second subset of the backpanel contact members in the backpanel device, wherein the first and second display devices are disposed on the backpanel device adjacent to each other, and wherein an image displayed using the first and second display devices appears seamlessly across the boundary between the first and second display devices.

14. The display system of claim 1, comprising first and second backpanel devices, wherein the first and second backpanel devices are disposed adjacent to each other, and wherein the display device is coupleable with portions of the first and second backpanel devices.

15. The display system of claim 1, comprising:
first and second display devices; and
first and second backpanel devices;
wherein the first and second backpanel devices are disposed adjacent to each other;
wherein the first and second display devices are disposed adjacent to each other and disposed respectively on the first and second backpanel devices; and
wherein an image displayed using the first and second display devices appears seamless to a viewer across a boundary between the first and second display devices.

16. The display system of claim 1, wherein the display drive circuit comprises an RF transceiver circuit, a processor circuit, and a bus system coupling the RF transceiver circuit, the processor circuit, and the backpanel contact members;
wherein the RF transceiver is configured to wirelessly receive a data signal; and
wherein the processor circuit is configured to receive the data signal from the RF transceiver, process the data signal, and distribute the processed data signal to the backpanel contact members using the bus.

17. A display system comprising:
a backpanel device having a side edge portion and a backpanel interconnect portion, wherein the backpanel interconnect portion includes patterned backpanel contact members, the backpanel contact members having corresponding conductors that extend to the side edge portion of the backpanel device;
a display device including a display surface and a planar interconnection surface, each of the display surface and the planar interconnection surface having a substantially similar area, wherein the interconnection surface includes patterned display contact members that are distributed in a spaced-apart manner across the display device's interconnection surface; and an interposing member having a first surface with patterned contact members and a second surface with patterned contact members, wherein a pitch of the first surface contact members corresponds to a pitch the display contact members, and wherein a pitch of the second surface contact members corresponds to a pitch of the backpanel contact members;

wherein the patterned display contact members are removably coupleable with the first surface contact members and wherein the patterned backpanel contact members are removably coupleable with the second surface contact members.

18. The display system of claim 17, wherein a pitch of the patterned display contact members corresponds to a pitch of the patterned backpanel contact members.

* * * * *